(12) United States Patent
Wang

(10) Patent No.: US 8,207,596 B2
(45) Date of Patent: Jun. 26, 2012

(54) SELF-ALIGNMENT INSULATION STRUCTURE

(75) Inventor: Hon-Chun Wang, Taichung County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 12/883,152

(22) Filed: Sep. 15, 2010

(65) Prior Publication Data

US 2011/0001176 A1 Jan. 6, 2011

Related U.S. Application Data

(62) Division of application No. 12/121,768, filed on May 15, 2008, now Pat. No. 7,816,226.

(51) Int. Cl.
*H01L 23/58* (2006.01)

(52) U.S. Cl. .......... 257/647; 257/E27.091; 257/E29.201

(58) Field of Classification Search .................. 257/213, 257/301, E27.092, 647, E29.201, E29.091
See application file for complete search history.

(56) References Cited

U.S. PATENT DOCUMENTS

| | | | |
|---|---|---|---|
| 5,389,559 A | | 2/1995 | Hsieh |
| 5,460,987 A * | | 10/1995 | Wen et al. ..................... 438/151 |
| 6,750,499 B2 | | 6/2004 | Wu |
| 6,833,305 B2 | | 12/2004 | Mandelman |
| 7,078,756 B2 | | 7/2006 | Otani |
| 2006/0068547 A1 | | 3/2006 | Lee |
| 2007/0131983 A1 | | 6/2007 | Ban |
| 2010/0038746 A1 | | 2/2010 | Su |
| 2011/0024871 A1 | | 2/2011 | Su |

OTHER PUBLICATIONS

To Sze,"Semiconductor Devices. Physics and Technology", 2002, p. 30, Fig. 15; p. 537, Appendix F, Table.
Michael Quirk, "Semiconductor Manufacturing Technology", 2001, Prentice-Hall Inc., pp. 225, 264, 265.

* cited by examiner

*Primary Examiner* — A. Sefer
*Assistant Examiner* — Nikolay Yushin
(74) *Attorney, Agent, or Firm* — Winston Hsu; Scott Margo

(57) ABSTRACT

An insulation structure is provided. The insulation structure includes a deep trench filled with silicon and disposed in a substrate, a first oxide layer serving as the insulation structure and disposed on the surface of the silicon in the deep trench, a first silicon layer disposed on the first oxide layer, a gate disposed on the first silicon layer and a shallow trench isolation adjacent to the deep trench.

7 Claims, 9 Drawing Sheets

SELF-ALIGNMENT INSULATION STRUCTURE

CROSS REFERENCE TO RELATED APPLICATIONS

This application is a divisional application of and claims the benefit of U.S. patent application Ser. No. 12/121,768, filed May 15, 2008.

BACKGROUND OF THE INVENTION

1. Field of the Invention

The present invention relates to an insulation structure. In particular, the present invention relates to a self-alignment insulation structure useful in the passing gates.

2. Description of the Prior Art

In the development of DRAM process, word lines are arranged to pass over other trench capacitors which are not controlled by this word line in order to increase the element density on the chip and enhance the integration effectively. FIG. 1 illustrates the word lines passing over other trench capacitors which are not controlled by this word line. As shown in FIG. 1, on the layout pattern, each word line 101 passes other adjacent non-active areas over the active area 102, the deep trench capacitors 103 and the shallow trench isolations (STI) . Before the deep trench capacitors 103 are actually formed, there are only the shallow trench isolations and the active area 102 in/on the substrate because any non-STI region is an active area. Such word lines that pass over the non-active areas and the deep trench capacitors are called "passing gates" because the gate elements are only formed on the overlapping regions of the word lines 101 and the active area 102.

A layer of an insulation structure must be constructed between the passing gates and the deep trench capacitors to ensure the electrical insulation between the passing gates and the deep trench capacitors because the passing gates and the deep trench capacitors both are electrical elements and the passing gates need to pass over the deep trench capacitors of other memory cells. As shown in FIG. 1, the insulation 105 in fact serves as the electrical insulation between the passing gates 104 and the deep trench capacitors 103. It should be noted that merely one insulation structure is shown on FIG. 1 and other incomplete insulation structures are omitted, which suggests other insulation structures may also exist on other deep trench capacitors.

Sequentially speaking, the shallow trench isolation is formed first, next the deep trench capacitors then the insulation structure of the passing gates are defined when the passing gates pass over the shallow trench isolation and the deep trench capacitors. FIGS. 2-8 illustrate the conventional steps to form the insulation structure of the passing gates. First, as shown in FIG. 2, the deep trench capacitor 203 is formed after the shallow trench isolation 202 is formed in the substrate 201. The steps to form the deep trench capacitor 203 may be that, the profile of the deep capacitor trench is first formed by etching, next the bottom of the capacitor trench is enlarged to form a bottle shape to pursue a larger inner surface, afterwards other elements such as the collar oxide is formed, then the capacitor trench is filled with a conductive material, such as silicon. After the deep trench capacitor 203 is formed, other necessary processes such as ion well (not shown) implantation, cleaning, or thermal annealing are performed. Secondly, as shown in FIG. 3 the pad oxide layer 204 and the silicon nitride layer 205 are sequentially formed on the substrate 201 to facilitate the formation of the photo-mask to define the location of the insulation structure. Afterwards, as shown in FIG. 4, the BARC layer 206 is formed and a patterned photoresist 207 is formed to define the location of the insulation structure for the passing gates. In the meantime, the photoresist 207 should precisely cover the shallow trench isolation 202 and the deep trench capacitor 203 to ensure the insulation structure for the passing gates is in the correct position.

Then, as shown in FIG. 5, part of the BARC layer 206 and the silicon nitride layer 205 are removed by etching. Next, as shown in FIG. 6, the remaining photoresist 207 and the BARC layer 206 are removed to leave the required silicon nitride layer 205 and the pad oxide layer 204. In the meantime the silicon nitride layer 205 serves as a hard mask. Thereafter, as shown in FIG. 7, the pad oxide layer 204 which is not masked by the silicon nitride layer 205 is removed by etching using the silicon nitride layer 205 as the hard mask. Afterwards, in FIG. 8, a gate oxide layer (not shown) is formed and the gate 210 is formed on the gate oxide layer and the passing gate 220 is formed on the silicon nitride layer 205 conventionally. Theoretically speaking, the passing gate 220 now is supposed to be formed on the deep trench capacitor 203. In other words, the silicon nitride layer 205 and the pad oxide layer 204 which are not removed in FIG. 7 now serve as the insulation structure 221 for the passing gate 220. The gate 210 is useful in controlling the deep trench capacitor 203 to form a memory cell. This way, the insulation structure 221 ensures that an excellent insulation is established between the passing gate 220 and the underlying, deep trench capacitor 203 to avoid shorts and to avoid interfering with the performance of the DRAM.

However, the above-mentioned procedure not only requires an additional mask to define the position of the insulation structure 221, moreover it is extremely difficult to define the insulation structure 221, i.e. the pad oxide layer 204 and the silicon nitride layer 205, above the deep trench capacitor 203 with little misalignment. Furthermore, there is no sufficient protection to keep the exposed shallow trench isolation 202 and the deep trench capacitor 203 from the possible damages resulting from the ion well implantation, cleaning, or thermal annealing before the completion of the insulation structure 221.

Therefore, a novel method for forming an insulation structure is needed to eliminate an additional mask to define the position of the insulation structure, to get rid of the misalignment between the insulation structure and the previously-established deep trench capacitor, and further to protect the substrate, the shallow trench isolation and the deep trench capacitor from exposure and from the collateral damages brought about by the formation of other regions before the completion of the insulation structure.

SUMMARY OF THE INVENTION

The present invention therefore provides a novel method for forming an insulation structure for use in the passing gates. In the novel method, the opening of the deep trench is directly used as a basis to establish a first oxide layer and a first silicon layer for the insulation structure before the removal of the hard mask for defining the opening of the deep trench. Accordingly, on one hand an additional mask to define the position of the insulation structure may be eliminated. On the other hand, the first oxide layer and the first silicon layer would be precisely formed on the deep trench by way of self-alignment to collaterally get rid of the misalignment between the insulation structure and the previously-established deep trench capacitor, and to perfectly meet the demand that the insulation structure is supposed to precisely cover the previously-established deep trench capacitor. Further, before the completion of the insulation structure, the pad oxide, the first oxide layer and the first silicon layer together would protect the substrate, the shallow trench isolation and the deep trench from exposure, which keeps the substrate, the shallow trench isolation and the deep trench from the collateral damages brought about by the formation of other regions. The above three problems are solved by one single solution simultaneously.

The present invention therefore provides a method for forming a self-alignment insulation structure. First, a substrate is provided. The substrate includes a deep trench filled with silicon as well as a shallow trench isolation adjacent to the deep trench. A pad oxide and a hard mask are sequentially formed on the substrate. The pad oxide and the hard mask together define the opening of the deep trench. Then, an oxidation step is carried out so that the surface of the Si forms a first oxide layer serving as the needed insulation structure. Later, a first Si layer is formed in the opening to cover the first oxide layer. Afterwards, the hard mask is removed. Next, a passing gate is formed on the insulation structure.

The present invention again provides an insulation structure. The insulation structure includes a deep trench filled with silicon and disposed in a substrate, a first oxide layer serving as the insulation structure and disposed on the surface of the silicon in the deep trench, a first silicon layer disposed on the first oxide layer, a gate disposed on the first silicon layer and a shallow trench isolation adjacent to the deep trench.

These and other objectives of the present invention will no doubt become obvious to those of ordinary skill in the art after reading the following detailed description of the preferred embodiment that is illustrated in the various figures and drawings.

DETAILED DESCRIPTION

The present invention provides a novel method for forming a self-alignment insulation structure for use in the passing gates. In the novel method, an additional mask to define the position of the insulation structure maybe eliminated. The method also gets rid of the misalignment between the insulation structure and the previously-established deep trench capacitor. Further, the substrate, the shallow trench isolation and the deep trench capacitors will not be exposed before the completion of the insulation structure, which protects the shallow trench isolation and the deep trench capacitors from the collateral damages of the processes such as ion well implantation, cleaning, or thermal annealing. This method of the present invention may greatly improve the yield of the DRAM.

Figure 1:
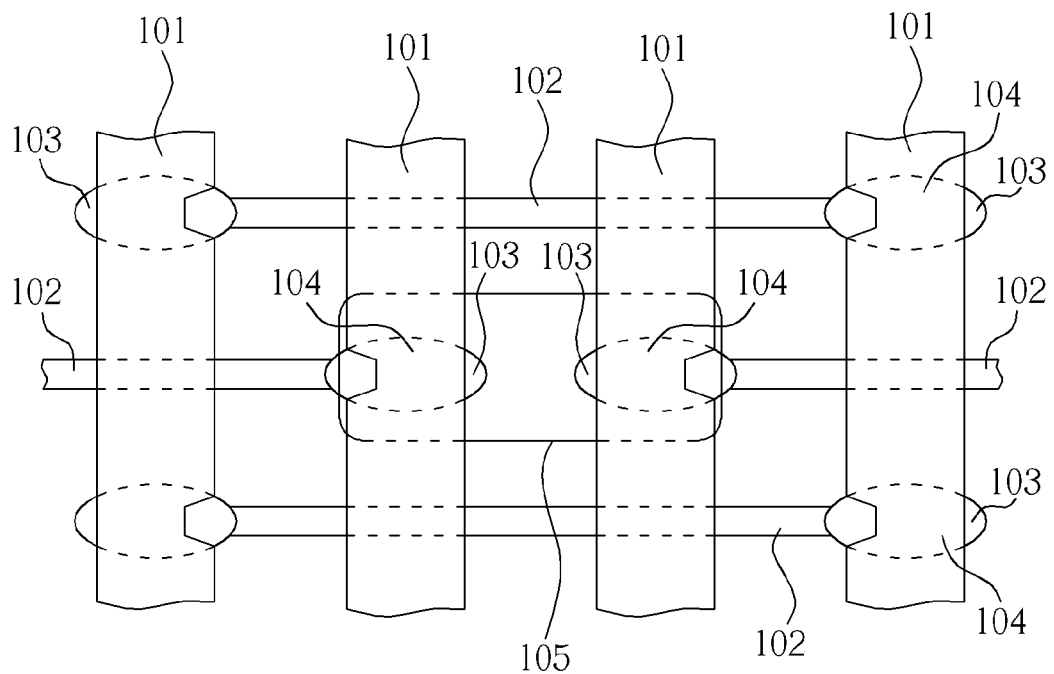
FIG. 1 illustrates word lines passing other uncontrolled deep trench capacitors over shallow trench isolations.
Figure 2:
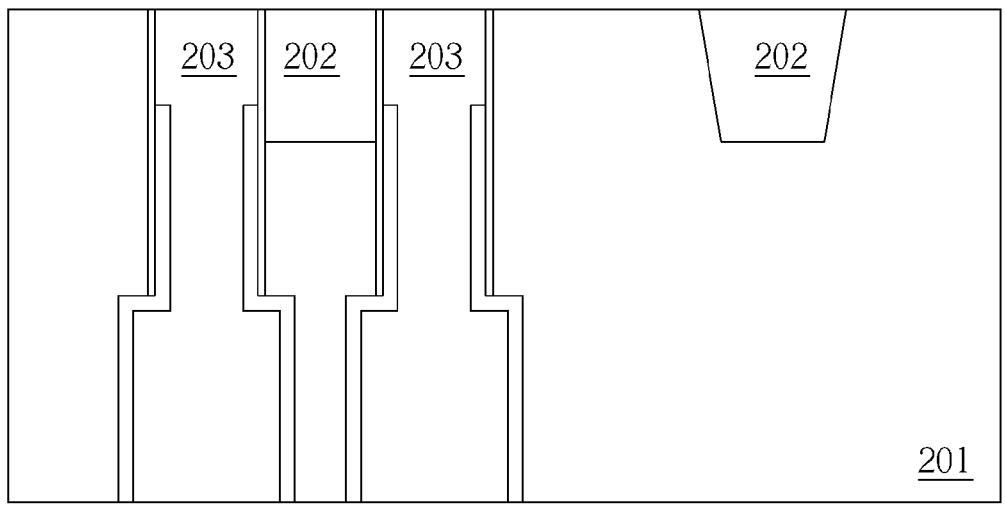
FIGS. 2-8 illustrate the conventional steps to form the insulation structure of the passing gates.
Figure 3:
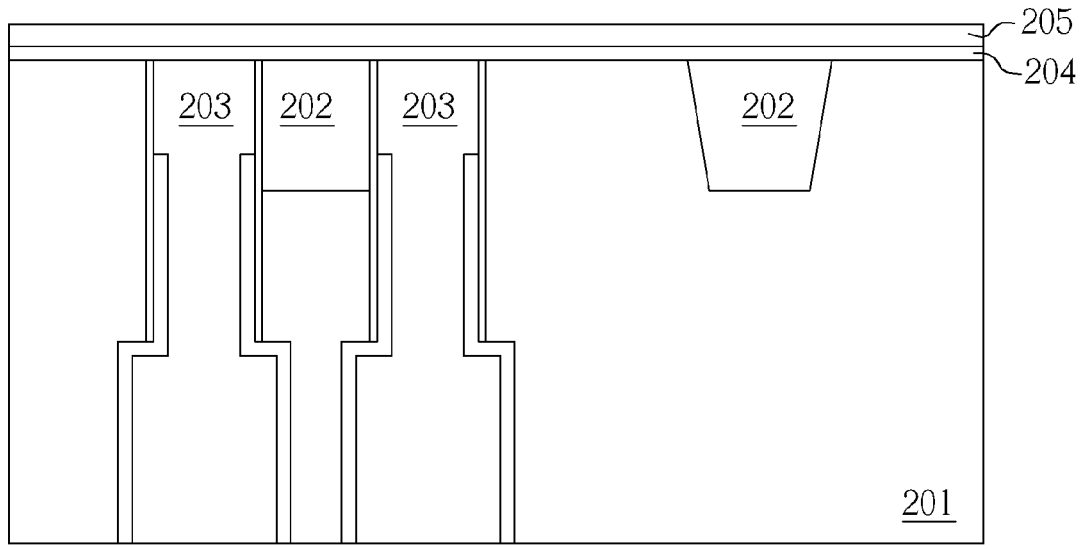
Figure 4:
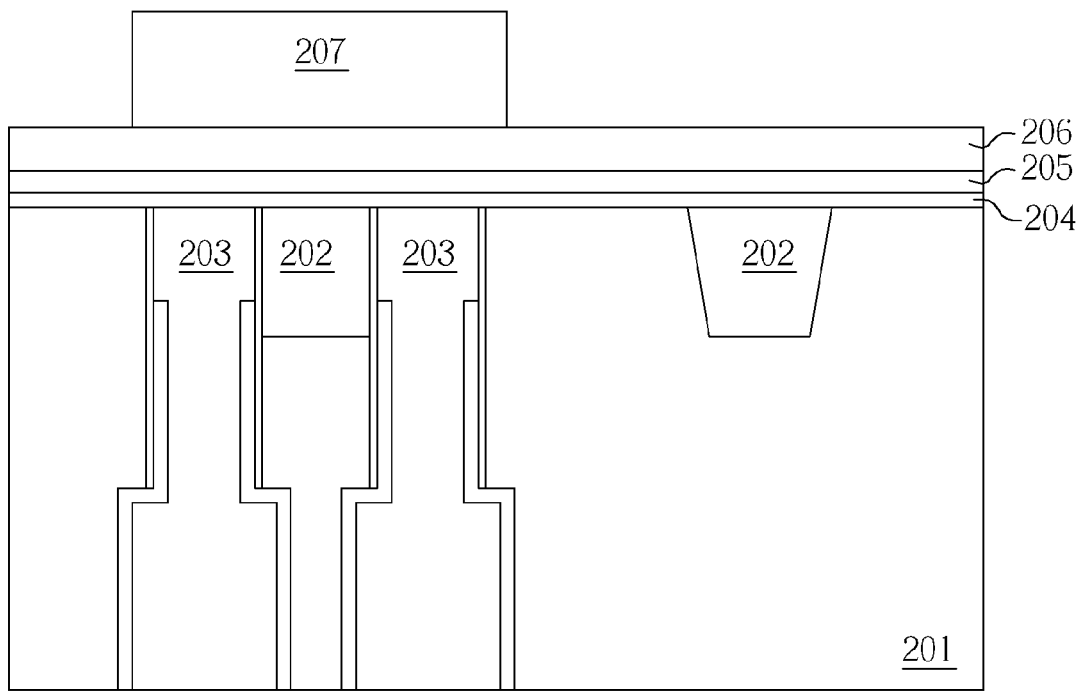
Figure 5:
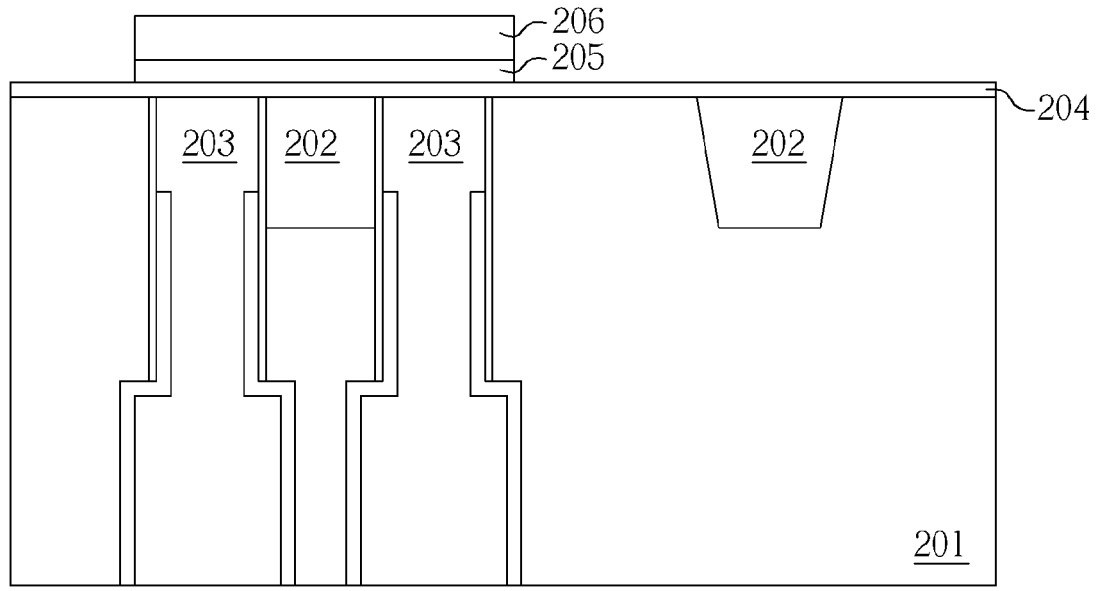
Figure 6:
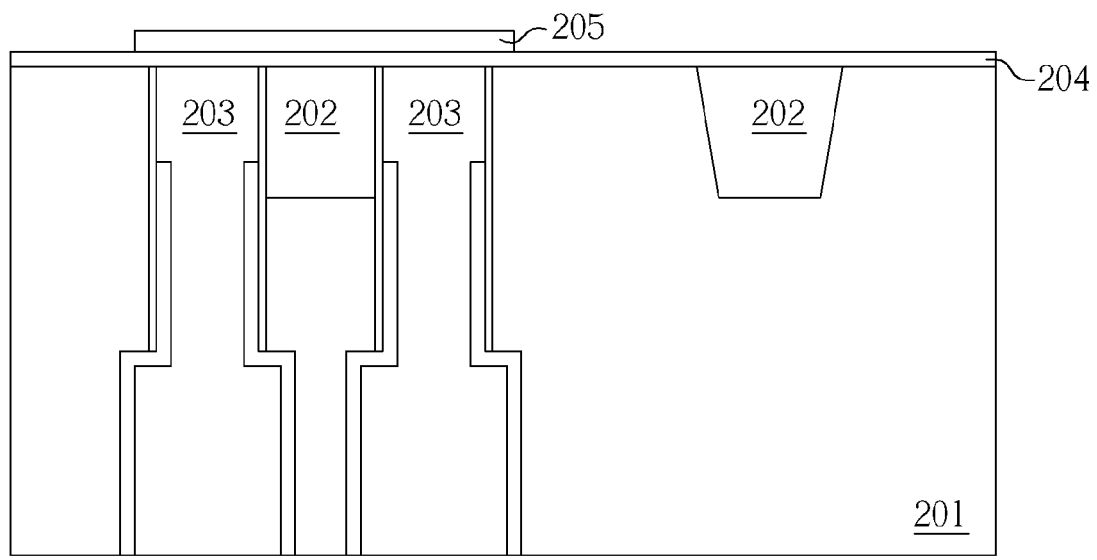
Figure 7:
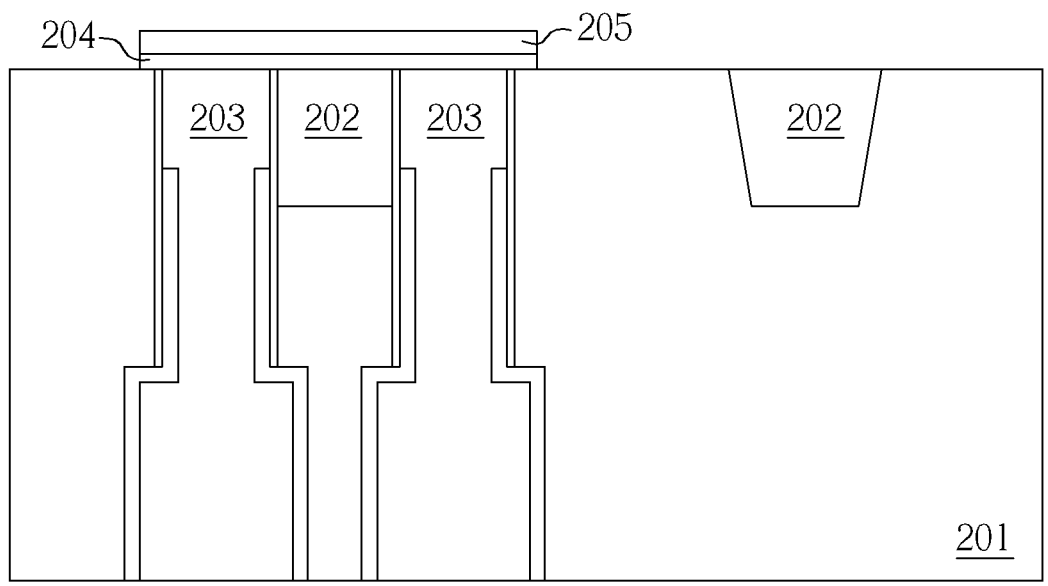
Figure 8:
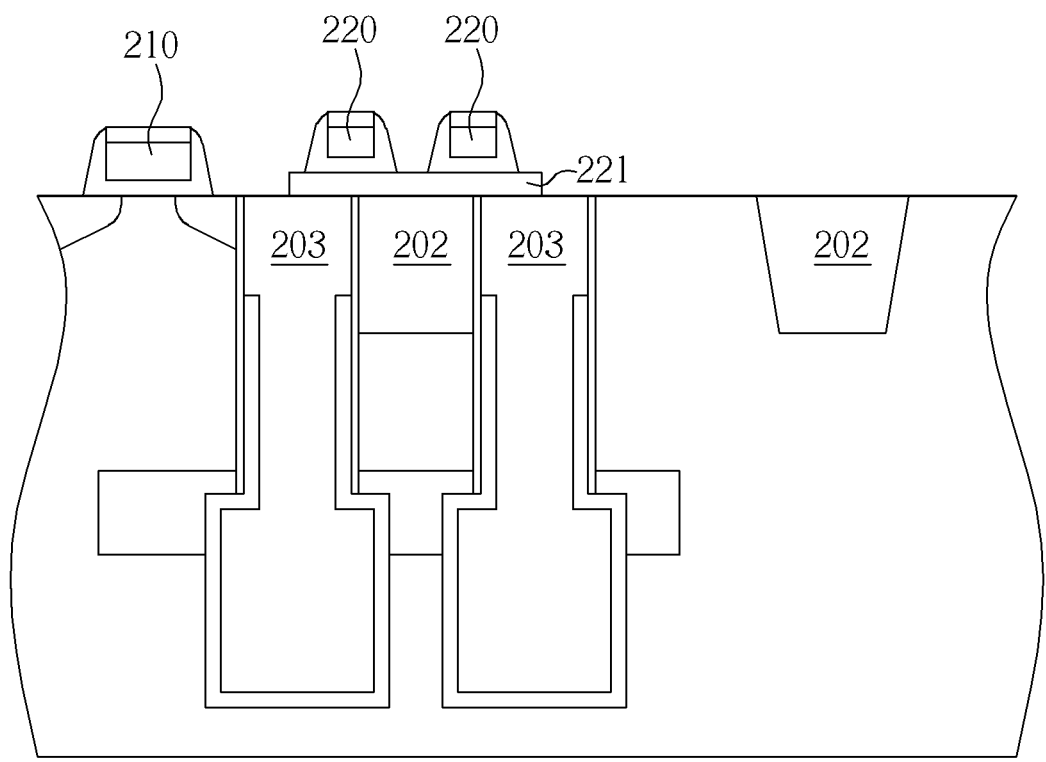
Figure 9:
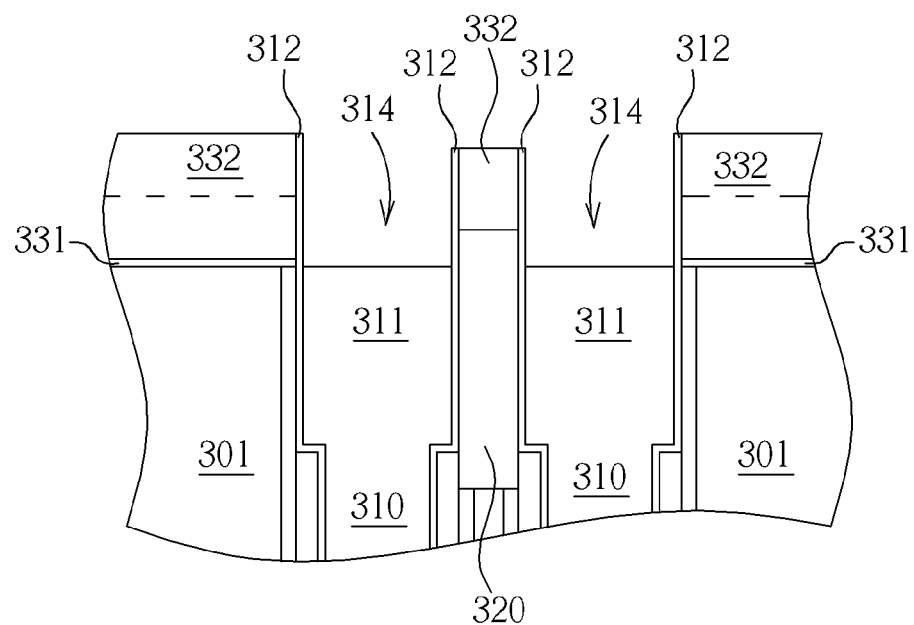
FIGS. 9-17 illustrate a preferred embodiment of the method of forming an insulation structure of the present invention.

FIGS. 9-17 illustrate a preferred embodiment of the method of forming an insulation structure of the present invention. First, as shown in FIG. 9 a substrate 301 is provided. The substrate 301 includes a deep trench 310 filled with silicon 311 for use as a capacitor as well as a shallow trench isolation 320 adjacent to the deep trench 310. A pad oxide layer 331 and a hard mask 332 are sequentially formed on the substrate 301. Optionally, a composite layer 312 such as a composite layer made of oxide-nitride-oxide (ONO) serving as a capacitor dielectric layer may be disposed between the substrate 301 and the Si 311 in the deep trench 310. In addition, the deep trench 310 may further include other structures, such as a bottle bottom or a collar oxide layer.

Generally speaking, the substrate 301 may be a semiconductor material, such as Si. The hard mask 332 may be made of a nitride, oxynitride, carbide or the composite thereof, such as silicon nitride, silicon oxynitride, silicon carbide. The pad oxide layer 331 may include a silicon oxide. In this preferred embodiment, the shallow trench isolation 320 is established before the formation of the deep trench 310. For example, the shallow trench isolation 320 may be firstly defined by the conventional shallow trench process on the substrate 301. Secondly, the patterned hard mask 332 is defined by a photoresist and an etching process is performed to etch through part of the substrate 301, the pad oxide layer 331 and the shallow trench isolation 320 to form trenches 310, so that the shallow trench isolation 320 lies between the deep trenches 310. After the deep trench 310 is formed, the bottom of the capacitor trench may be further enlarged to be in a shape of a bottle, other parts may also be established, such as a collar oxide, and the deep trenches 310 may be filled with silicon 311 to complete the procedure. Those details are well known by persons skilled in the art and of ordinary skill in the art, and will not be described here. Please note that, the hard mask 332 should not be removed during the etching of the deep trench 310 and before the completion of the deep trench capacitor.

Because the pad oxide layer 331 and the hard mask 332 on the substrate 301 both share an opening 314 defining the deep trench 310, it is the intention of the present invention that the hard mask 332 is reserved for the elimination of another mask and for the benefits of self-alignment, i.e. the opening 314 of the deep trench 310 is useful in defining the position of the insulation structure for use in the passing gates.

Figure 10:
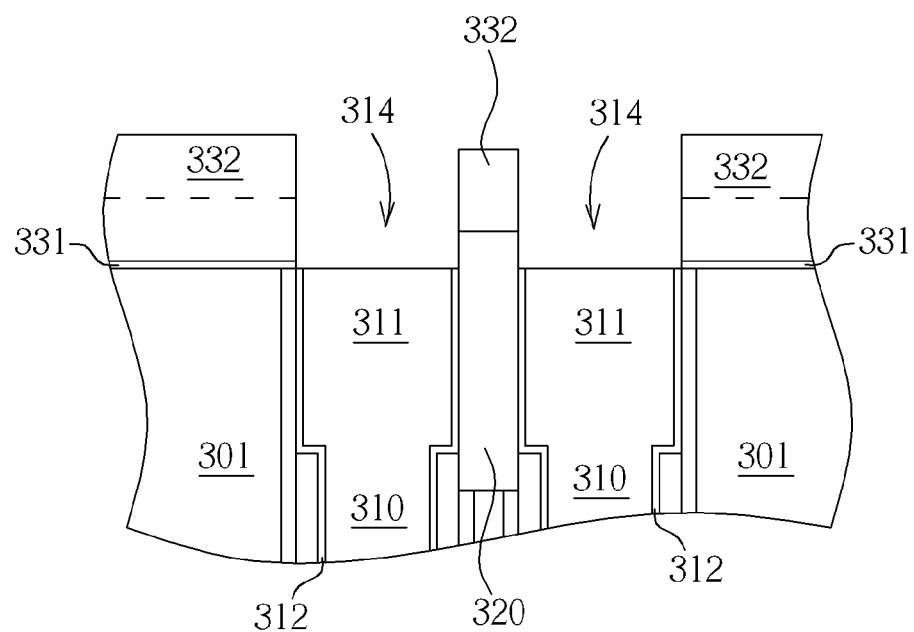

Secondly, as shown in FIG. 10, if the composite layer 312 is formed on the sidewall of the deep trench 310, the exposed composite layer 312 should be removed first. For example, if the composite layer 312 is made of oxide-nitride-oxide (ONO), it can be removed by conditions such as hot phosphoric acid.

Figure 11:
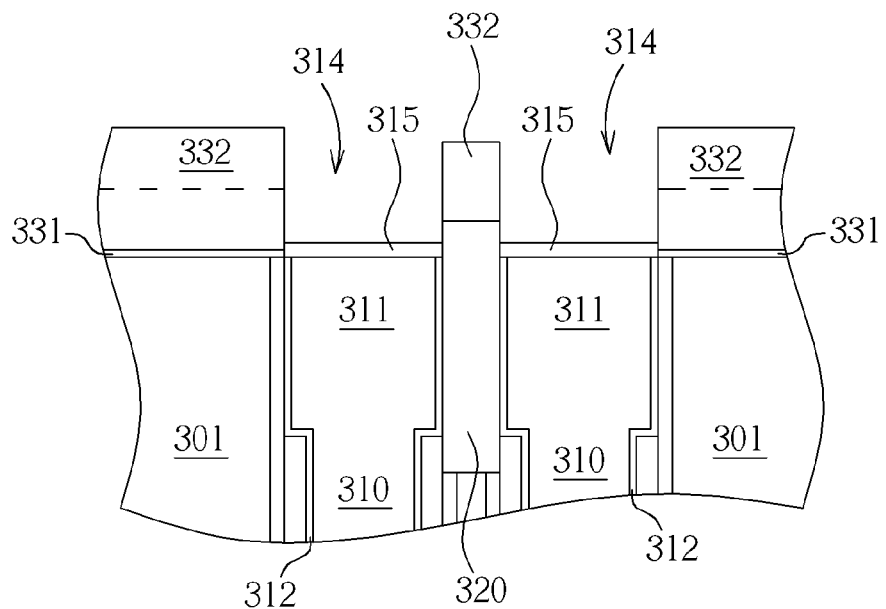

Then, please refer to FIG. 11, an oxidation step is carried out so that the surface of the Si 311 in the deep trench 310 forms a first oxide layer 315. The first oxide layer 315 may serve as part of the needed insulation structure. The first oxide layer 315 may be formed by a thermal oxidation, such as by a dry thermal oxidation or a wet thermal oxidation to form the first oxide layer 315. Preferably, the first oxide layer 315 and the nearby pad oxide layer 331 may together protect the substrate 301, the deep trench 310 and the shallow trench isolation 320.

Figure 12:
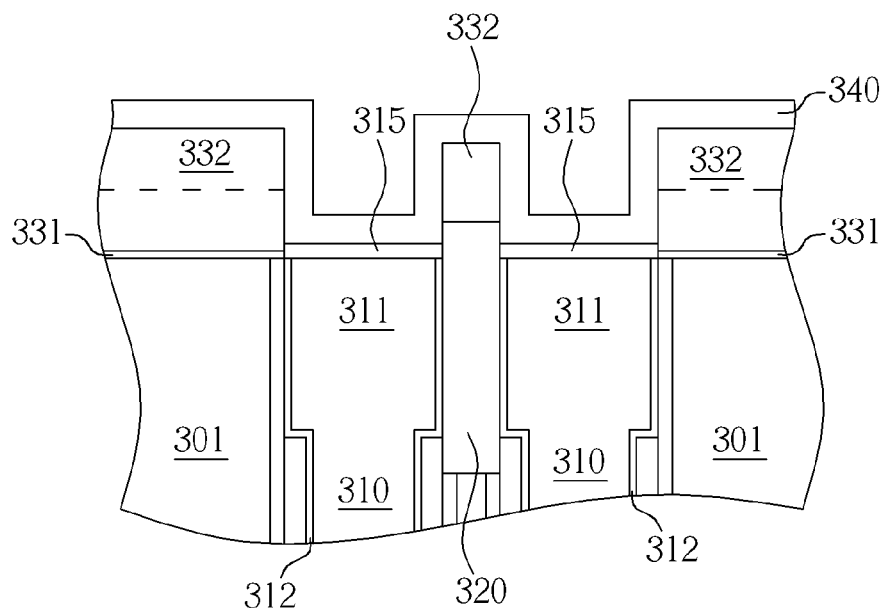
Figure 13:
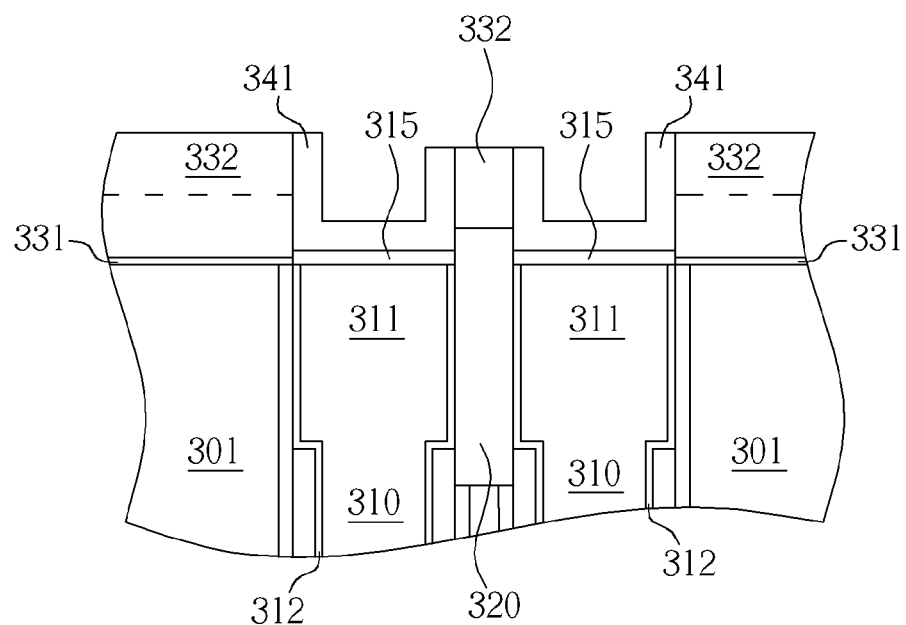

Later, a Si layer 340 is formed in the opening 314 to cover the first oxide layer 315. The Si layer 340 may be composed of an amorphous silicon, a poly-Si or the combination thereof formed by a chemical vapor deposition (CVD). The procedures to form the Si layer 340 may be that, as shown in FIG. 12, a silicon layer 340 may entirely and conformally cover the first oxide layer 315 and the hard mask 332 by the chemical vapor deposition. Then, as shown in FIG. 13, the excess silicon layer 340 may be removed by a planarization process, such as chemical-mechanical planarization or chemical-mechanical polishing, so that the first silicon layer 341 covers the first oxide layer 315 and part of the hard mask 332. After the chemical-mechanical planarization, preferably the first silicon layer 341 forms an asymmetric U-shape from a side view on the first oxide layer 315. The thickness of the first silicon layer 341 may be 50 Å-400 Å.

In the method of the present invention, the hard mask 332 for defining the trench 310 is retained and the opening 314 of the trench 310 is directly used for constructing the first oxide layer 315 and the first Si layer 341 that serve as the insulation structure for use in the passing gates. As a result, on one hand the step to establish an additional mask to define the position of the insulation structure may be eliminated. On the other hand, the first oxide layer 315 would be precisely formed on the deep trench 310 on the inducement of the silicon 311 by way of self-alignment to automatically get rid of the misalignment between the following insulation structure and the previously-established trench capacitor, and to perfectly meet the demand that the insulation structure is supposed to precisely cover the previously-established trench capacitor.

Figure 14:
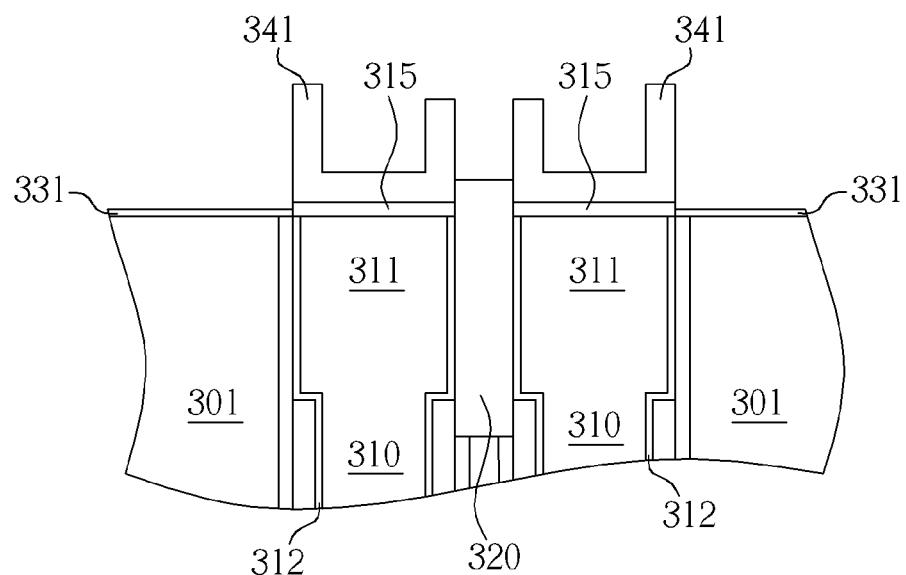

Afterwards, as shown in FIG. 14, the hard mask 332 is removed. If the hard mask 332 is made of a nitride, the hard mask 332 may be removed by conditions such as hot phosphoric acid. The pad oxide layer 331 remains on the substrate 301 and the first oxide layer 315 and the first Si layer 341 are disposed on the deep trench 310.

After the hard mask 332 is removed, other logic regions on the substrate 301 may be optionally modified by request, such as the thermal treatment, cleaning, ion well implantation or annealing. Because the pad oxide layer 331 retains on the substrate 301 and the first oxide layer 315 and the first Si layer 341 cover the deep trench 310, the substrate 301, the shallow trench isolation 320 and the deep trench capacitors 310 will not be exposed and are protected from the collateral damages while other regions are constructed. Please note that the first Si layer 341 may shrink and be oxidized due to damages after the construction of other regions, such as annealing of the wells or cleaning.

Figure 15:
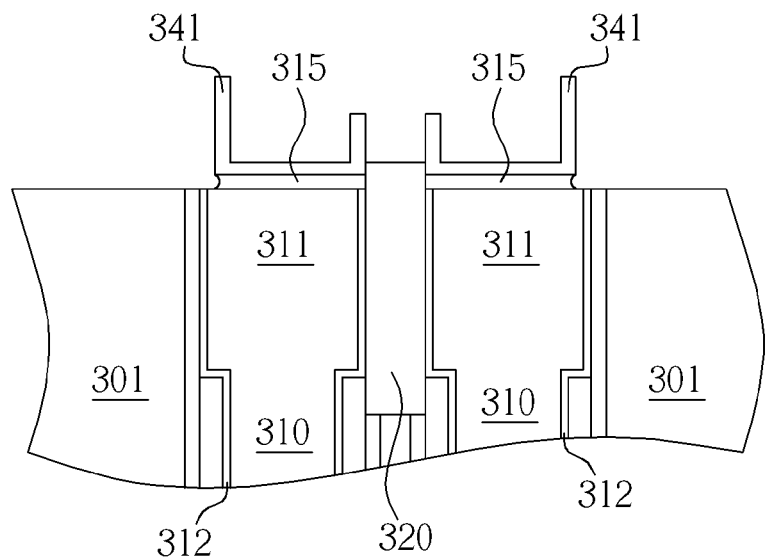

Then, as shown in FIG. 15, the original pad oxide layer 331 on the substrate 301 is to be removed and the substrate 301 is accordingly exposed. The original pad oxide layer 331 may be removed by a fluoro-containing etchant, such as HF or buffer oxidation etchant (BOE). While the original pad oxide layer 331 is removed, part of the oxidized first Si layer 341 and the first oxide layer 315 may also be collaterally removed. So, the first Si layer 341 and the first oxide layer 315 shrink.

Figure 16:
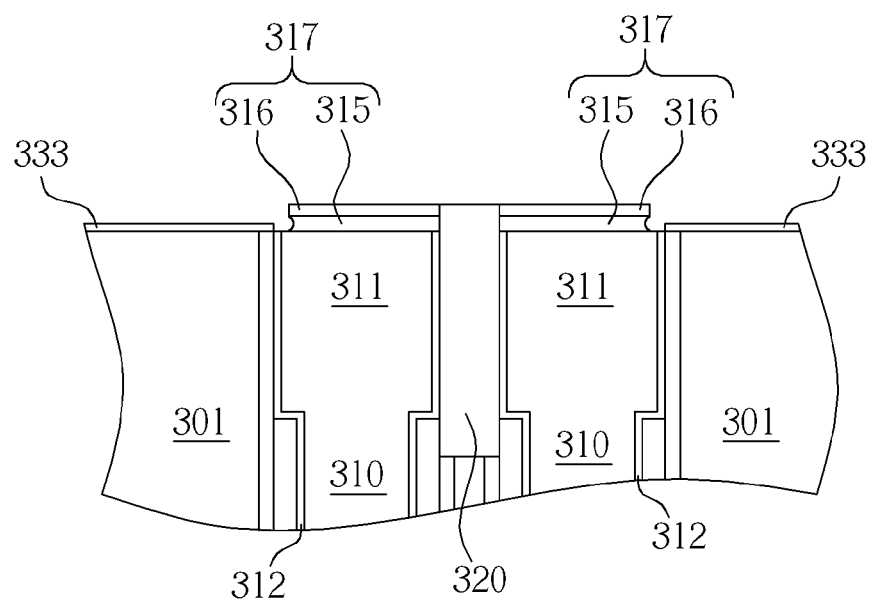
Figure 17:
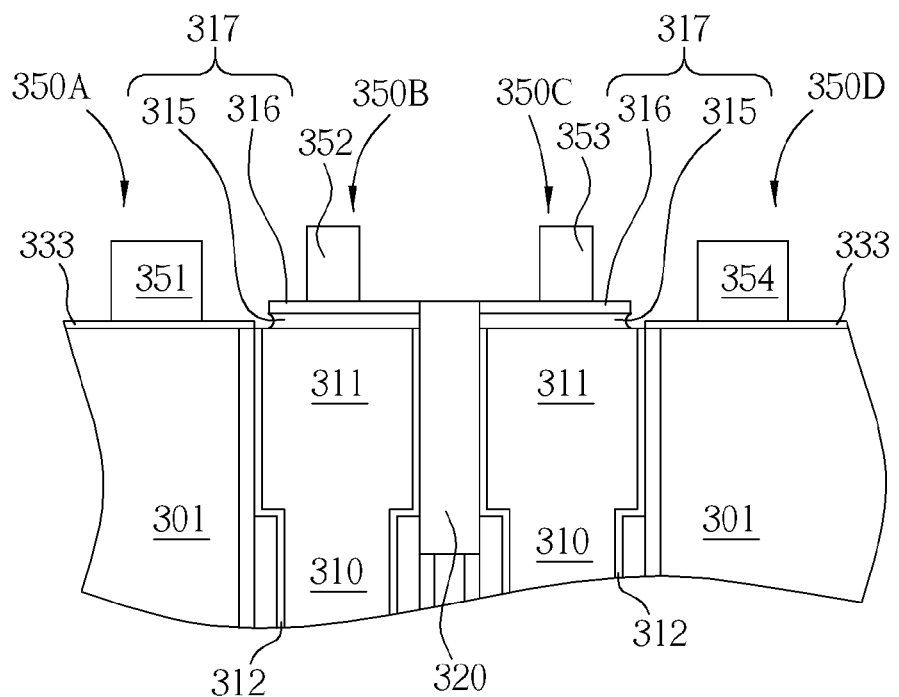

Later, as shown in FIG. 16, at least a thermal process is performed on the exposed substrate 301 to form another oxide layer 333 of better quality for the gate dielectric layer and to transform the first Si layer 341 into a second oxide layer 316 to be part of the insulation structure 317. Because other logic regions (not shown) and ESD elements (not shown) on the substrate 301 require the gate dielectric layer too, for example oxide layers of different thickness in different regions formed by multiple thermal oxidations and multiple local removal steps, the oxide layer 333 serving as the gate dielectric layer of the gate for controlling the deep trench capacitor is formed by the thermal oxidation collaterally when oxide layers of different thickness for other logic regions and ESD elements are formed on the substrate 301. Alternatively, the oxide layer 333 may be formed at the end. The first Si layer 341 is collaterally transformed into the second oxide layer 316 and therefore combines with the first oxide layer 315 to be part of the insulation structure 317. After taking all of the steps that would oxidize the first silicon layer and remove the oxidized silicon layer into consideration, the thickness of the first Si layer 341 may be estimated in advance so that the first Si layer 341 may be completely transformed into the second oxide layer 316 before the first Si layer 341 turns into the gate, or alternatively the first Si layer 341 may be partially transformed into the second oxide layer 316 so part of the first Si layer 341 retains. If the first Si layer 341 is too thick, it may adversely affects the etching of the gates because most of the first Si layer 341 will not turn into the second oxide layer 316. If the first Si layer 341 is too thin, it may not able to protect the underlying first oxide layer 315 because the entire first Si layer 341 would turn into the second oxide layer 316 to early and too fast. FIG. 16 illustrates that the first Si layer has completely transformed into the second oxide layer.

Now, gates and word lines are formed on the substrate 301, and simultaneously word lines are arranged to pass other adjacent trenches 310 over the shallow trench isolation 320. The gates and the word lines may be formed by conventional methods. A shown in FIG. 17, individual word lines 350A, 350B, 350C, 350D pass over the substrate 301 and the deep trenches 310. On one hand, some of the word lines 350A/350D now become the gates 351/354 formed on the gate oxide layer 333, and control the corresponding deep trench capacitors 310 (i.e. the deep trench capacitors 310 under the passing gates 352/353). On the other hand, the word lines 350B/350C passing over the deep trench capacitors 310 now become the passing gates 352/353 constructed on the insulation structure 317. Because the insulation structure 317 is sandwiched between the deep trench capacitors 310 and the passing gates 352/353, plus that the insulation structure 317 is made of at least the first oxide layer 315 and the second oxide layer 316, it becomes an excellent insulation structure of the deep trench capacitors 310 and the passing gates 352/353.

Figure 18:
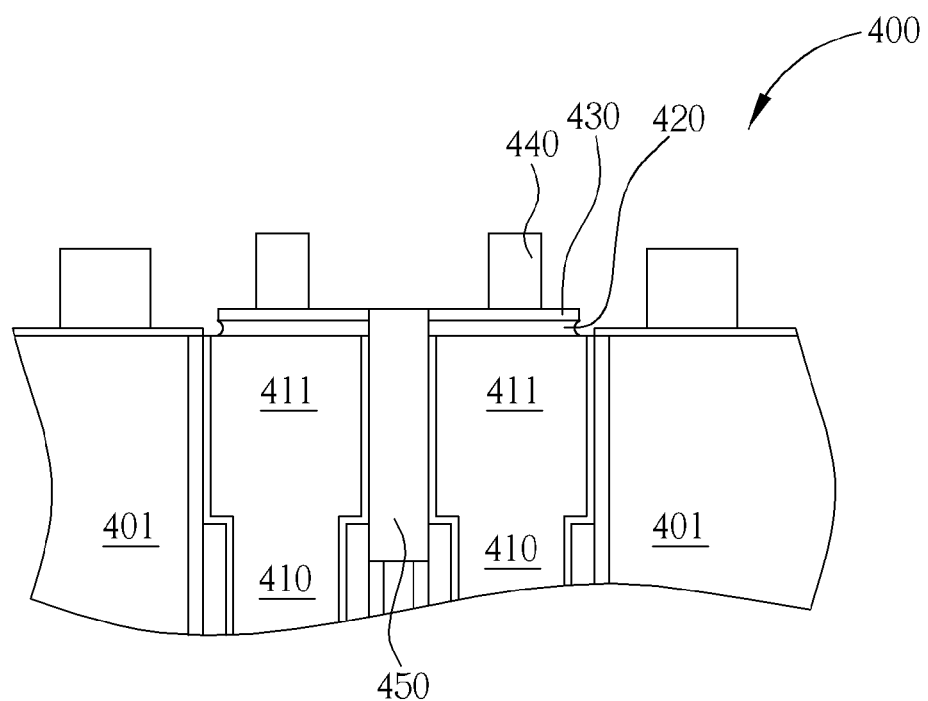
FIG. 18 illustrates a preferred embodiment of the insulation structure of the present invention.

The present invention again provides an insulation structure 400. A shown in FIG. 18, the insulation structure 400 includes a substrate 401, a deep trench 410, a first oxide layer 420, a first silicon layer 430, a gate 440, and a shallow trench isolation 450. The deep trench 410 is disposed in the substrate 401 and filled with silicon 411. The first oxide layer 420 which is on the silicon 411 serves as the insulation structure. The first silicon layer 430 is disposed on the first oxide layer 420. The gate 440 is disposed on the first silicon layer 430. The shallow trench isolation 450 is adjacent to the deep trench. The method to form the insulation structure 400 maybe similar to the method which is earlier described and the details will not be described here.

In the method of the present invention, the hard mask for defining the opening of the deep trench is intentionally retained, and the opening of the deep trench is directly used as a basis to establish a first oxide layer and a first silicon layer for the insulation structure before the removal of the hard mask. Accordingly, on one hand an additional mask to define the position of the insulation structure may be eliminated. On the other hand, the first oxide layer and the first silicon layer would be precisely formed on the deep trench by way of self-alignment to collaterally get rid of the misalignment between the insulation structure and the previously-established trench capacitor and the insulation structure and the active regions, and to perfectly meet the demand that the insulation structure is supposed to precisely cover the previously-established trench capacitor. Further, before the completion of the insulation structure, the pad oxide, the hard mask, the first oxide layer and the first silicon layer together would protect the substrate, the shallow trench isolation and the deep trench from exposure, which keeps the substrate, the shallow trench isolation and the deep trench from the collateral damages brought about by the formation of other regions.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A semiconductor structure, comprising:
    a substrate;
    a deep trench filled with silicon and disposed in said substrate;
    a first oxide layer disposed on the surface of said silicon in said deep trench, wherein said first oxide layer serves as an insulation structure;
    a first silicon layer disposed on said first oxide layer;
    a gate disposed on said first silicon layer; and
    a shallow trench isolation adjacent to said deep trench.

2. The semiconductor structure of claim 1, serving as said insulation structure of a passing gate.

3. The semiconductor structure of claim 1, wherein said gate is not adjacent to said shallow trench isolation.

4. The semiconductor structure of claim 1, wherein said shallow trench isolation is adjacent to said deep trench, to said first oxide layer and to said first silicon layer.

5. The semiconductor structure of claim 1, wherein said shallow trench isolation solely comprises an insulating material.

6. The semiconductor structure of claim 1, wherein said first oxide layer and said first silicon layer approximately align with said deep trench.

7. The semiconductor structure of claim 1, wherein said gate and said first silicon layer are mutually different.

* * * * *